United States Patent
Ozeki

(10) Patent No.: US 8,331,157 B2
(45) Date of Patent: Dec. 11, 2012

(54) SEMICONDUCTOR MEMORY DEVICE

(75) Inventor: Takao Ozeki, Niigata (JP)

(73) Assignee: Panasonic Corporation, Osaka (JP)

( * ) Notice: Subject to any disclaimer, the term of this patent is extended or adjusted under 35 U.S.C. 154(b) by 105 days.

(21) Appl. No.: 13/014,360

(22) Filed: Jan. 26, 2011

(65) Prior Publication Data

US 2011/0122677 A1    May 26, 2011

Related U.S. Application Data

(63) Continuation of application No. PCT/JP2010/003398, filed on May 20, 2010.

(30) Foreign Application Priority Data

Sep. 16, 2009 (JP) .................... 2009-214506

(51) Int. Cl.
G11C 11/34    (2006.01)

(52) U.S. Cl. .......... 365/185.18; 365/185.2; 365/185.21; 365/185.24

(58) Field of Classification Search ............ 365/185.18, 365/185.2, 185.21, 185.24
See application file for complete search history.

(56) References Cited

U.S. PATENT DOCUMENTS

| | | | | |
|---|---|---|---|---|
| 6,038,166 A | * | 3/2000 | Wong | 365/185.21 |
| 6,081,448 A | * | 6/2000 | Pasotti et al. | 365/185.2 |
| 6,118,701 A | * | 9/2000 | Uekubo | 365/185.2 |
| 6,128,228 A | * | 10/2000 | Pasotti et al. | 365/185.21 |
| 6,826,103 B2 | * | 11/2004 | Moon et al. | 365/185.21 |
| 6,831,858 B2 | * | 12/2004 | Hirano et al. | 365/185.18 |
| 7,020,037 B2 | * | 3/2006 | Anzai et al. | 365/185.2 |
| 7,158,415 B2 | * | 1/2007 | Bedarida et al. | 365/185.2 |
| 7,345,905 B2 | * | 3/2008 | Pio et al. | 365/185.18 |
| 7,701,779 B2 | * | 4/2010 | Maayan et al. | 365/185.24 |
| 2001/0048126 A1 | | 12/2001 | Hibino | |
| 2004/0013000 A1 | | 1/2004 | Torii | |
| 2004/0130943 A1 | | 7/2004 | Hirano et al. | |
| 2004/0233729 A1 | | 11/2004 | Iwase et al. | |
| 2006/0239093 A1 | | 10/2006 | Mukunoki et al. | |

FOREIGN PATENT DOCUMENTS

| | | |
|---|---|---|
| JP | 07-153287 | 6/1995 |
| JP | 10-233095 | 9/1998 |
| JP | 2001-344985 | 12/2001 |
| JP | 3237610 | 12/2001 |
| JP | 2004-039075 | 2/2004 |
| JP | 2004-054966 | 2/2004 |
| JP | 2004-342274 | 12/2004 |
| JP | 2006-294135 | 10/2006 |

* cited by examiner

*Primary Examiner* — Trong Phan

(74) *Attorney, Agent, or Firm* — McDermott Will & Emery LLP

(57) ABSTRACT

First main bit lines correspond to at least one first memory cell. Second main bit lines correspond to at least one second memory cell. At least one sense amplifier outputs read data according to a difference between a voltage of any one of the first main bit lines and a voltage of any one of the second main bit lines. A voltage supply switching section supplies a predetermined reference voltage to one of the first main bit lines corresponding to one of the second main bit lines in which a current according to a threshold voltage of the at least one second memory cell is generated. A resistance switching section forms electrical connection between a ground node and the one of the second main bit lines in which the current according to the threshold voltage of the at least one second memory cell is generated with a predetermined resistance value.

23 Claims, 15 Drawing Sheets

FIG. 17
delay circuit 301
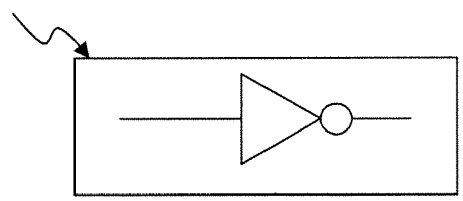
single-stage inverter
delay circuit 301
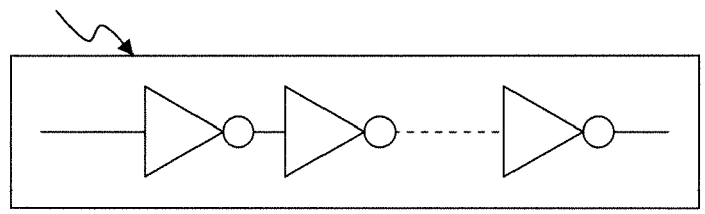
cascade-coupled inverters
delay circuit 301
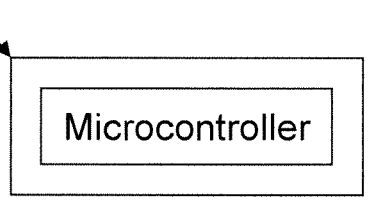

SEMICONDUCTOR MEMORY DEVICE

CROSS-REFERENCE TO RELATED APPLICATION

This is a continuation of PCT International Application PCT/JP2010/003398 filed on May 20, 2010, which claims priority to Japanese Patent Application No. 2009-214506 filed on Sep. 16, 2009. The disclosures of these applications including the specifications, the drawings, and the claims are hereby incorporated by reference in their entirety.

BACKGROUND

The present disclosure relates to semiconductor memory devices, and more particularly to a technique for controlling the threshold voltages of reference cells included in semiconductor memory devices.

FIG. 14 illustrates an example configuration of a conventional semiconductor memory device. In the semiconductor memory device, memory cells MC911 and MC921 are coupled to a word line WL91, and memory cells MC912 and MC922 are coupled to a word line WL92. The memory cells MC911 and MC912 are coupled to a sub bit line SBL91, and the memory cells MC921 and MC922 are coupled to a sub bit line SBL92. A voltage supply VMS9 applies a read voltage to a read target memory cell of the memory cells MC911, MC912, ..., MC922.

Main bit lines MBL91 and MBL92 correspond to the sub bit lines SBL91 and SBL92, respectively. A decoder DEC9 couples one of the sub bit lines SBL91 and SBL92, which is coupled to the read target memory cell, to the main bit line corresponding to the sub bit line. Reference bit lines RBL91 and RBL92 correspond to the main bit lines MBL91 and MBL92, respectively. A reference cell RC91 corresponds to the memory cells MC911 and MC912, and a reference cell RC92 corresponds to the memory cells MC921 and MC922. The reference cells RC91 and RC92 are coupled to a reference word line RWL91, and coupled to the reference bit lines RBL91 and RBL92 via switches RSL91 and RSL92, respectively. A voltage supply VRS9 applies a read voltage to one of the reference cells RC91 and RC92 corresponding to the read target memory cell. A sense amplifier SA91 is coupled to the main bit line MBL91 and the reference bit line RBL91, and a sense amplifier SA 92 is coupled to the main bit line MBL92 and the reference bit line RBL92.

FIG. 15 illustrates an example configuration of the sense amplifier SA91 shown in FIG. 14. In the sense amplifier SA91, a level shifter LS9 converts a voltage of the main bit line MBL91 and a voltage of the reference bit line RBL91 to voltages within a range of operation of a differential amplifier circuit COM9. The differential amplifier circuit COM9 amplifies a voltage pair from the level shifter LS9 and outputs as output voltages O91 and O92. A latch circuit LAT9 converts voltage levels of the output voltages O91 and O92 to logic levels (voltage levels at which it can be determined whether data is 0 or 1).

When a memory cell MC911 is read, the voltage supply VMS9 applies a read voltage (e.g., a voltage of about 1 V) to the memory cell MC911. The decoder DEC9 couples the sub bit line SBL91 to the main bit line MBL91. A drive voltage (e.g., a voltage of about 4 V) is applied to the word line WL91. Also, the voltage supply VRS9 applies a read voltage (e.g., a voltage of about 1 V) to the reference cell RC91, the switch RSL91 is put in a conduction state. A drive voltage (e.g., a voltage of about 4 V) is applied to the reference word line RWL91.

A bit line parasitic capacitance (CBL) of the main bit line MBL91 is charged with a current generated in the main bit line MBL91 (i.e., a current generated in the read target memory cell MC911). Thus, as shown in an upper graph of FIG. 16, a voltage (VinM) of the main bit line MBL91 gradually rises as time progresses. A voltage (VinR) of the reference bit line RBL91 rises similarly. The amount of rise in the voltage (VinM) of the main bit line MBL91 over time changes depending on magnitude of the threshold voltage of the memory cell MC911 (or MC912).

At the start of the latch operation of the latch circuit LAT9 of the sense amplifier SA91, when the voltage (VinM) of the main bit line MBL91 is higher than the voltage (VinR) of the reference bit line RBL91, the latch circuit LAT9 sets the voltage level of the output voltage O91 to a "1" data level (see the solid line in the lower graph of FIG. 16). On the other hand, when the voltage (VinM) of the main bit line MBL91 is lower than the voltage (VinR) of the reference bit line RBL91, the latch circuit LAT9 sets the voltage level of the output voltage O91 to a "0" data level (see the dashed line in the lower graph of FIG. 16). Note that a voltage waveform Vo91 corresponds to the waveform of the output voltage O91, and a voltage waveform Vo92 corresponds to the waveform of the output voltage O92.

As described above, it is determined whether the voltage level of the output voltage O91 is a "1" data level or a "0" data level in accordance with the magnitude relation between a current value of a reference cell (a voltage value of a reference bit line) and a current value of a memory cell (a voltage value of a main bit line) input to the sense amplifier. Each of the memory cells MC911, MC912, ..., MC922 defines whether data stored in the memory cell is "1" or "0" in accordance with the threshold voltage of the memory cell. Since a change in a current value (a difference between a current value where data "0" is stored and a current value where data "1" is stored) according to a change in the threshold voltage of the memory cell is small, the threshold voltages of the reference cells RC91 and RC92 need to be accurately set so that current values of the reference cells RC91 and RC92 are equal to a median of a change width of the current value of the memory cell (a median between a current value where data "0" is stored and a current value where data "1" is stored).

When CMOS transistors are used as the reference cells RC91 and RC92, characteristic variations in manufacture reduce yield. Furthermore, when advance circuit design is used for expanding the acceptable range of the characteristic variations, a chip area increases. On the other hand, when nonvolatile memory devices are used as the reference cells RC91 and RC92, characteristic variations of the reference cells in manufacture can be reduced by controlling the threshold voltages of the reference cells in testing. This hardly causes the reduction in the yield and the increase in the chip area, as described above. Moreover, characteristic variations in read circuits such as a sense amplifier can be controlled by a reference cell being a nonvolatile memory device, and thus, an increase in an operation margin and an improvement in a specification are expected.

In general, the threshold voltage of a reference cell is initialized as follows. First, the current value of the reference cell is measured. When the current value of the reference cell does not reach a desired current value, a bias voltage is applied to the reference cell to change the threshold voltage of the reference cell. Until the current value of the reference cell reaches the desired current value, this process is repeated. As such, the threshold voltage of the reference cell is controlled.

While, in recent years, various methods have been suggested for controlling the threshold voltage of a reference cell, higher-speed control is required in view of manufacturing costs. Also, in order to reduce an increase in an area, high-speed control is performed by comparing and determining whether the current value of the reference cell is equal to a desired current value, using a sense amplifier for normal read operation. For example, Japanese Patent Publication No. 2004-39075 and Japanese Patent Publication No. 2006-294135 teach achieving high-speed control using a reference cell other than a reference cell coupled to a reference bit line. Japanese Patent No. 3237610 and Japanese Patent Publication No. H07-153287 teach eliminating an external terminal (an external terminal required for monitoring a current value when controlling a reference cell) by including a current supply within a chip.

SUMMARY

However, in Japanese Patent Publication No. 2004-39075 and Japanese Patent Publication No. 2006-294135, another reference cell is required, the area is difficult to reduce. In particular, in Japanese Patent Publication No. 2004-39075, since the threshold voltage of the other reference cell needs to be controlled as well, control time is difficult to reduce. In Japanese Patent No. 3237610, since each reference cell requires a current supply, a chip area increases. Japanese Patent Publication No. H07-153287 is not suited for high-speed read operation and an operation current increases, since comparison and determination are executed while allowing a steady current to flow in normal read operation. Although it is considered to simply replace the other reference cell of Japanese Patent Publication No. 2004-39075 with a voltage line to control a reference cell, high-precise control of the threshold voltage may not be performed.

It is an objective of the present disclosure to provide a technique for improving control precision of the threshold voltage of a reference cell in a semiconductor memory device.

According to one aspect of the present disclosure, a semiconductor memory device includes a plurality of first main bit lines corresponding to at least one first memory cell; a plurality of second main bit lines corresponding to at least one second memory cell; at least one sense amplifier configured to output read data according to a difference between a voltage of any one of the plurality of first main bit lines and a voltage of any one of the plurality of second main bit lines; a voltage supply switching section configured to supply a predetermined reference voltage to one of the plurality of first main bit lines corresponding to one of the plurality of second main bit lines in which a current according to a threshold voltage of the at least one second memory cell is generated; and a resistance switching section configured to form electrical connection between a ground node and the one of the plurality of second main bit lines in which the current according to the threshold voltage of the at least one second memory cell is generated with a predetermined resistance value.

In the semiconductor memory device, a steady current according to the second memory cell (e.g., a reference cell) can be converted to a voltage. This reduces fluctuations in voltages of the second main bit lines (e.g., reference bit lines) caused by noise such as fluctuations in a power supply voltage. Thus, the sense amplifier accurately detects voltage differences between the first and second main bit lines, thereby accurately controlling the threshold voltage of the second memory cell.

According to another aspect of the present disclosure, a semiconductor integrated circuit includes a semiconductor memory device including a plurality of first main bit lines corresponding to at least one first memory cell, a plurality of second main bit lines corresponding to at least one second memory cell, and at least one sense amplifier configured to output read data according to a difference between a voltage of any one of the plurality of first main bit lines and a voltage of any one of the plurality of second main bit lines; a voltage supply switching section configured to supply a predetermined reference voltage to one of the plurality of first main bit lines corresponding to one of the plurality of second main bit lines in which a current according to a threshold voltage of the at least one second memory cell is generated; and a resistance switching section configured to form electrical connection between a ground node and the one of the plurality of second main bit lines in which the current according to the threshold voltage of the at least one second memory cell is generated with a predetermined resistance value.

In the semiconductor integrated circuit, a steady current according to the second memory cell can be converted to a voltage. This reduces fluctuations in voltages of the second main bit lines (e.g., reference bit lines) caused by noise such as fluctuations in a power supply voltage. Thus, the sense amplifier accurately detects voltage differences between the first and second main bit lines, thereby accurately controlling the threshold voltage of the second memory cell.

According to another aspect of the present disclosure, an electronic device includes a semiconductor memory device including a plurality of first main bit lines corresponding to at least one first memory cell, a plurality of second main bit lines corresponding to at least one second memory cell, and at least one sense amplifier configured to output read data according to a difference between a voltage of any one of the plurality of first main bit lines and a voltage of any one of the plurality of second main bit lines; a voltage supply switching section configured to supply a predetermined reference voltage to one of the plurality of first main bit lines corresponding to one of the plurality of second main bit lines in which a current according to a threshold voltage of the at least one second memory cell is generated; and a resistance switching section configured to form electrical connection between a ground node and the one of the plurality of second main bit lines in which the current according to the threshold voltage of the at least one second memory cell is generated with a predetermined resistance value.

In the electronic device, a steady current according to the second memory cell can be converted to a voltage. This reduces fluctuations in voltages of the second main bit lines caused by noise such as fluctuations in a power supply voltage. Thus, the sense amplifier accurately detects voltage differences between the first and second main bit lines, thereby accurately controlling the threshold voltage of the second memory cell.

BRIEF DESCRIPTION OF THE DRAWINGS

FIG. 17 illustrates examples of delay circuit 301 of FIGS. 12 and 13.

DETAILED DESCRIPTION

Embodiments will be described hereinafter with reference to the drawings. The following embodiments are merely examples and the present disclosure is not limited thereto.
Embodiment 1

Figure 1:
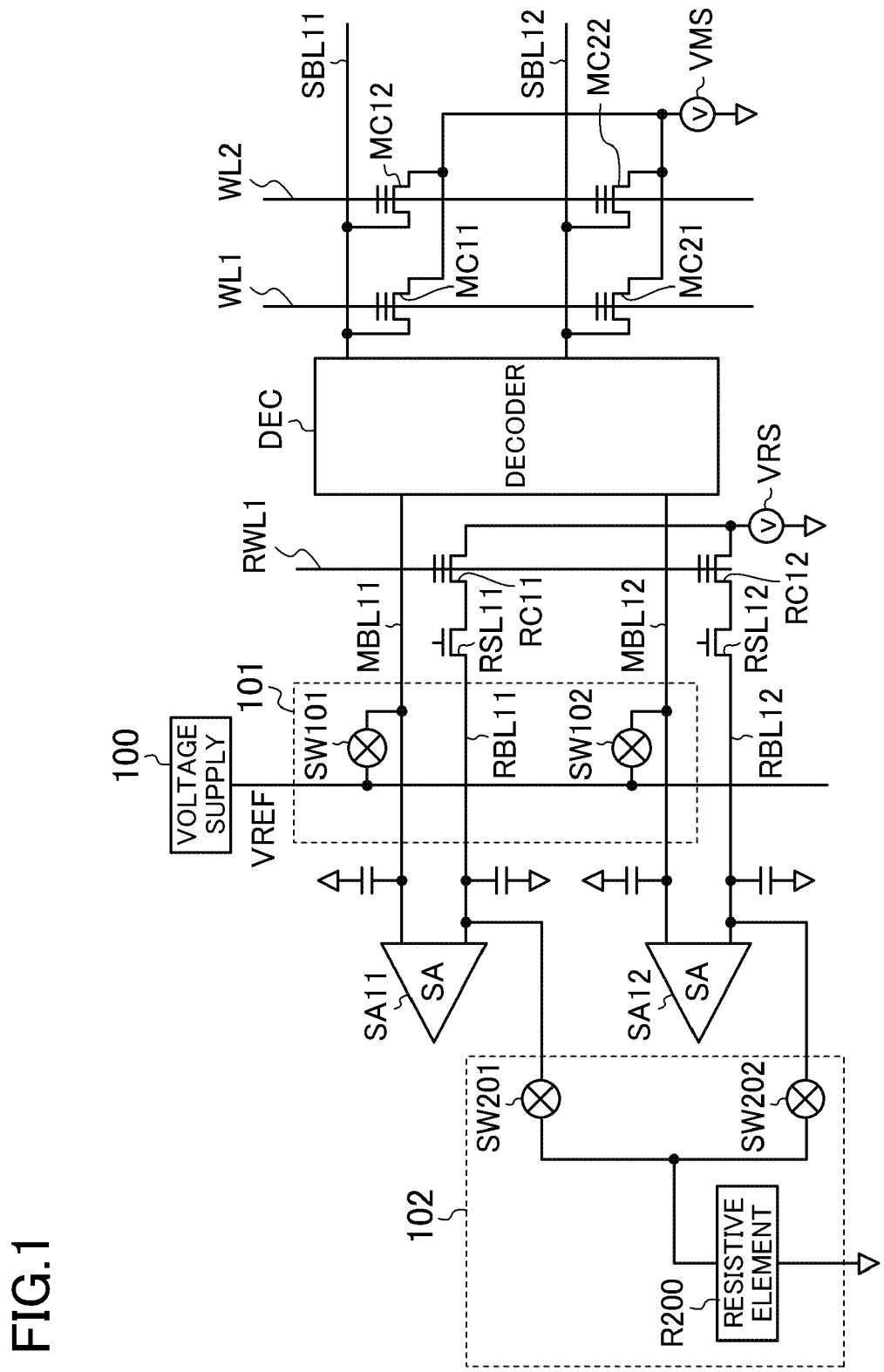
FIG. 1 illustrates an example configuration of a semiconductor memory device according to a first embodiment.

FIG. 1 illustrates an example configuration of a semiconductor memory device according to a first embodiment. The semiconductor memory device includes memory cells MC11, MC12, MC21, and MC22, word lines WL1 and WL2, sub bit lines SBL11 and SBL12, a voltage supply VMS, a decoder DEC, main bit lines MBL11 and MBL12, reference cells RC11 and RC12, a reference word line RWL1, a voltage supply VRS, switches RSL11 and RSL12, reference bit lines RBL11 and RBL12, sense amplifiers SA11 and SA12, a voltage supply 100, a voltage supply switching section 101, and a resistance switching section 102.

The memory cells MC11, MC12, . . . , MC22 are, for example, MONOS nonvolatile memory elements or floating gate nonvolatile memory elements. The memory cells MC11 and MC21 are coupled to the word line WL1, and the memory cells MC12 and MC22 are coupled to the word line WL2. Also, the memory cells MC11 and MC12 are coupled to the sub bit line SBL11, and the memory cells MC21 and MC22 are coupled to the sub bit line SBL12. The voltage supply VMS applies a read voltage to a read target memory cell of the memory cells MC11, MC12, . . . , MC22.

The main bit lines MBL11 and MBL12 correspond to the sub bit lines SBL11 and SBL12, respectively. The decoder DEC couples one of the sub bit lines SBL11 and SBL12, which is coupled to the read target memory cell, to the main bit line corresponding to the sub bit line. The reference bit lines RBL11 and RBL12 correspond to the main bit lines MBL11 and MBL12, respectively. The reference cells RC11 and RC12 are, for example, MONOS nonvolatile memory devices and floating gate nonvolatile memory devices. The reference cells RC11 and RC12 are coupled to the reference word line RWL1, and coupled to the reference bit lines RBL11 and RBL12 via the switches RSL11 and RSL12, respectively. The voltage supply VRS applies a read voltage to one of the reference cells RC11 and RC12 corresponding to the read target memory cell.

The sense amplifier SA11 outputs read data in accordance with a difference between a voltage of the main bit line MBL11 and a voltage of the reference bit line RBL11. The sense amplifier SA12 outputs read data in accordance with a difference between a voltage of the main bit line MBL12 and a voltage of the reference bit line RBL12.

Figure 2:
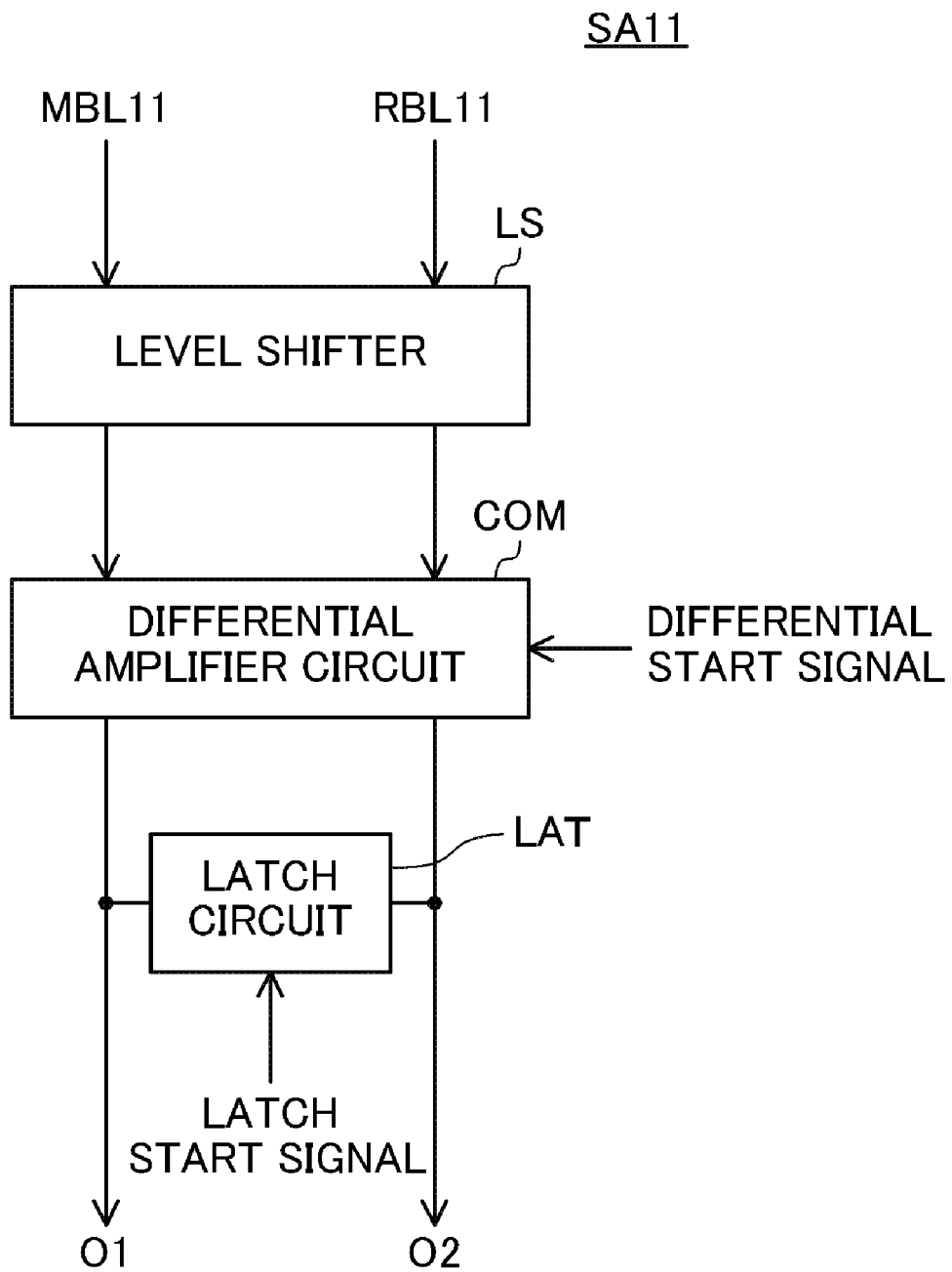
FIG. 2 illustrates an example configuration of a sense amplifier shown in FIG. 1.

FIG. 2 illustrates an example configuration of the sense amplifier SA11 shown in FIG. 1. The sense amplifier SA11 includes a level shifter LS, a differential amplifier circuit COM, and a latch circuit LAT. The level shifter LS converts the voltage of the main bit line MBL11 and the voltage of the reference bit line RBL11 to voltages within a range of operation of the differential amplifier circuit COM. The differential amplifier circuit COM amplifies a voltage pair from the level shifter LS and outputs as output voltages O1 and O2. The latch circuit LAT converts voltage levels of the output voltages O1 and O2 to logic levels (voltage levels at which it can be determined whether data is 0 or 1). Note that the sense amplifier SA12 has a similar configuration to the sense amplifier SA11.
Read Operation Read operation of the semiconductor memory device shown in FIG. 1 will be described below. An example is described where memory data stored in the memory cell MC11 is read.

First, a drive voltage (e.g., a voltage of about 4 V) is applied to the word line WL1 corresponding to the read target memory cell MC 11. The voltage supply VMS applies a read voltage (e.g., a voltage of about 1 V) to the memory cell MC11. The decoder DEC couples the sub bit line SBL11 corresponding to the memory cell MC11 to the main bit line MBL11. As a result, a current according to the threshold voltage of the memory cell MC11 is generated in the main bit line MBL11.

Next, a drive voltage (e.g., a voltage of about 4 V) is applied to the reference word line RWL1. The voltage supply VRS applies a read voltage (e.g., a voltage of about 1 V) to the reference cell RC11 corresponding to the read target memory cell MC11. The switch RSL 11 corresponding to the reference cell RC 11 is put in a conduction state. As a result, a current according to the threshold voltage of the reference cell RC11 is generated in the reference bit line RBL11.

Then, the sense amplifier SA11 outputs read data in accordance with the difference between the voltage of the main bit line MBL11 and the voltage of the reference bit line RBL11. For example, the sense amplifier SA11 sets a voltage level of the read data to a "1" data level, when the voltage of the main bit line MBL11 is higher than the voltage of the reference bit line RBL11; and sets the voltage level of the read data to a "0" data level, when the voltage of the main bit line MBL11 is lower than the voltage of the reference bit line RBL11. As such, data stored in the memory cell MC11 is read.
Control of Threshold Voltage of Reference Cell Next, control of the threshold voltage of reference cells in the semiconductor memory device shown in FIG. 1 will be described below. An example is described where the threshold voltage of the reference cell RC11 is controlled.

Figure 3:
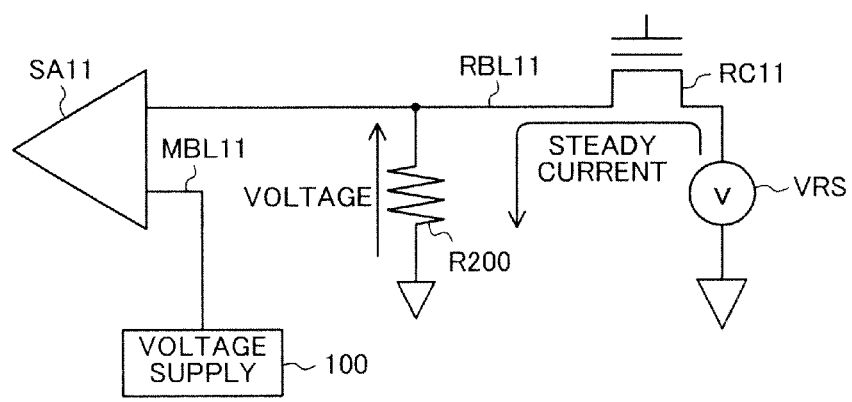
FIG. 3 illustrates connection when controlling the threshold voltage of a reference cell shown in FIG. 1.

First, the decoder DEC disconnects the main bit line MBL11 from the sub bit line SBL 11. In the voltage supply switching section 101, the switch SW 101 corresponding to the main bit line MBL11 is put in a conduction state. In the resistance switching section 102, a switch SW201 corresponding to the reference cell RC11 is put in a conduction state, a resistive element R200 is coupled to the reference bit line RBL11 corresponding to the reference cell RC11. Furthermore, a drive voltage (e.g., a voltage of about 4 V) is applied to the reference word line RWL1. A voltage supply VRS applies a read voltage (e.g., a voltage of about 1 V) to the reference cell RC11. Such control forms the connection shown in FIG. 3. Specifically, the reference bit line RBL 11, in which a current according to the threshold voltage of the reference cell RC 11 is generated, is coupled to the resistive element R200, the main bit line MBL11 corresponding to the reference bit line RBL11 is coupled to the voltage supply 100. As a result, a reference voltage VREF from the voltage supply 100 is supplied to the main bit line MBL11. A voltage according to the threshold voltage of the reference cell RC11 and the resistance value of the resistive element R200 is generated in the reference bit line RBL11.

An example is described where a current value of the reference cell RC11 is set to 20 μA. In this case, assume that the sense amplifier SA11 has the highest sensitivity when the difference between the voltage of the main bit line MBL11 and the voltage of the reference bit line RBL11 is 200 mV. The reference voltage VREF is preferably set to 200 mV, and the resistance value of the resistive element R200 is preferably set to 10 kΩ (=200 mV/20 μA).

Figure 4:
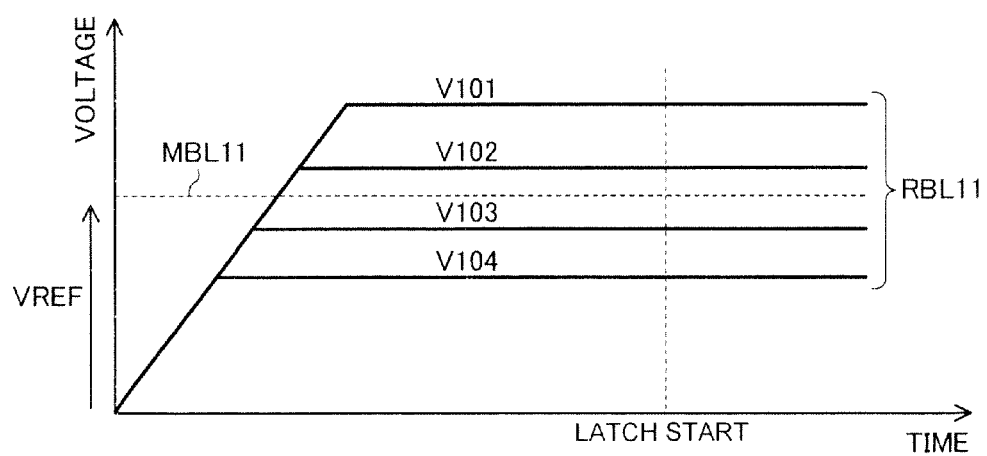
FIG. 4 illustrates a relation between a voltage of a main bit line and a voltage of a reference bit line when controlling the threshold voltage of the reference cell.

Then, the threshold voltage of the reference cell RC11 is changed so that the threshold voltage of the reference cell RC11 gradually increases. Each time when the threshold voltage of the reference cell RC11 is changed, after predetermined wait time (e.g., time required until the voltage of the reference bit line RBL11 is converged) has passed, read data output from the sense amplifier SA11 is monitored. As shown in FIG. 4, the voltage of the main bit line MBL11 is set to "the reference voltage VREF." On the other hand, the voltage of the reference bit line RBL11 gradually changes in the order of voltage waveforms V101, V102, V103, and V104 with an increase in the threshold voltage of the reference cell RC11. That is, the voltage (i.e., a voltage in a steady state) of the reference bit line RBL11 after the predetermined wait time has passed gradually decreases.

Next, when the voltage level of the read data output from the sense amplifier SA11 transits from the "1" data level to the "0" data level, the control of the threshold voltage of the reference cell RC11 is completed. As a result, the threshold voltage of the reference cell RC11 can be set to a desirable threshold voltage.

As described above, when the threshold voltage of the reference cell (RC11) is controlled, the resistive element (R200) is coupled to the reference bit line (RBL11) corresponding to the reference cell (RC11). This enables conversion of a steady current according to the reference cell (RC11) to a voltage, thereby reducing fluctuations in the voltage of the reference bit line (RBL11) caused by fluctuations in the power supply voltage. Since the sense amplifier (SA11) can accurately detect a voltage difference between the main bit line (MBL11) and the reference bit line (RBL11), the threshold voltage of the reference cell (RC11) can be accurately controlled.

Different from Japanese Patent Publication No. 2004-39075 and Japanese Patent Publication No. 2006-294135, the area of the semiconductor memory device can be reduced, since there is no need to use another reference cell. Also, control time of the threshold voltage of the reference cell can be reduced, since there is no need to control the threshold voltage of the other reference cell.

Note that, while FIG. 1 shows only the four memory cells MC11, MC12, . . . , MC22, the semiconductor memory device may include n×m memory cells, where n and m are integers of two or more, arranged in a matrix. In this case, the semiconductor memory device may include word lines, sub bit lines, main bit lines, reference cells, reference bit lines, and sense amplifiers according to the number of memory cells (e.g., number of lines).

In semiconductor memory device of FIG. 1, the threshold voltages of two or more reference cells may be controlled in parallel. Specifically, the voltage supply switching section 101 may supply a reference voltage to each of two or more main bit lines corresponding to the two or more reference bit lines in which currents according to the threshold voltages of the two or more reference cells are generated. The resistance switching section 102 may form electrical connection between a ground node and each of the two or more reference bit lines with a predetermined resistance value. For example, all of the switches SW101, SW102, SW201, and SW202 are put in a conduction state, thereby controlling the threshold voltages of the reference cells RC11 and RC12 in parallel.

While an example has been described where a single reference cell is provided for a single sense amplifier, a plurality of reference cells may be provided for a single sense amplifier as in a multiple-valued nonvolatile memory. Even in this configuration, the threshold voltages of the reference cells can be accurately controlled.

The above control of the threshold voltages of the reference cells may be performed after completion of manufacture of the semiconductor memory device, or after thermal stress testing in a testing process of the semiconductor memory device.

In the semiconductor memory device shown in FIG. 1, the voltage supply 100 and the resistive element R200 may be exchanged each other. This configuration allows the sense amplifiers SA11 and SA12 to execute data determination in read operation without using the reference cells RC11 and RC12, thereby reducing the area of the semiconductor memory device.

First Variation of Resistance Switching Section

Figure 5:
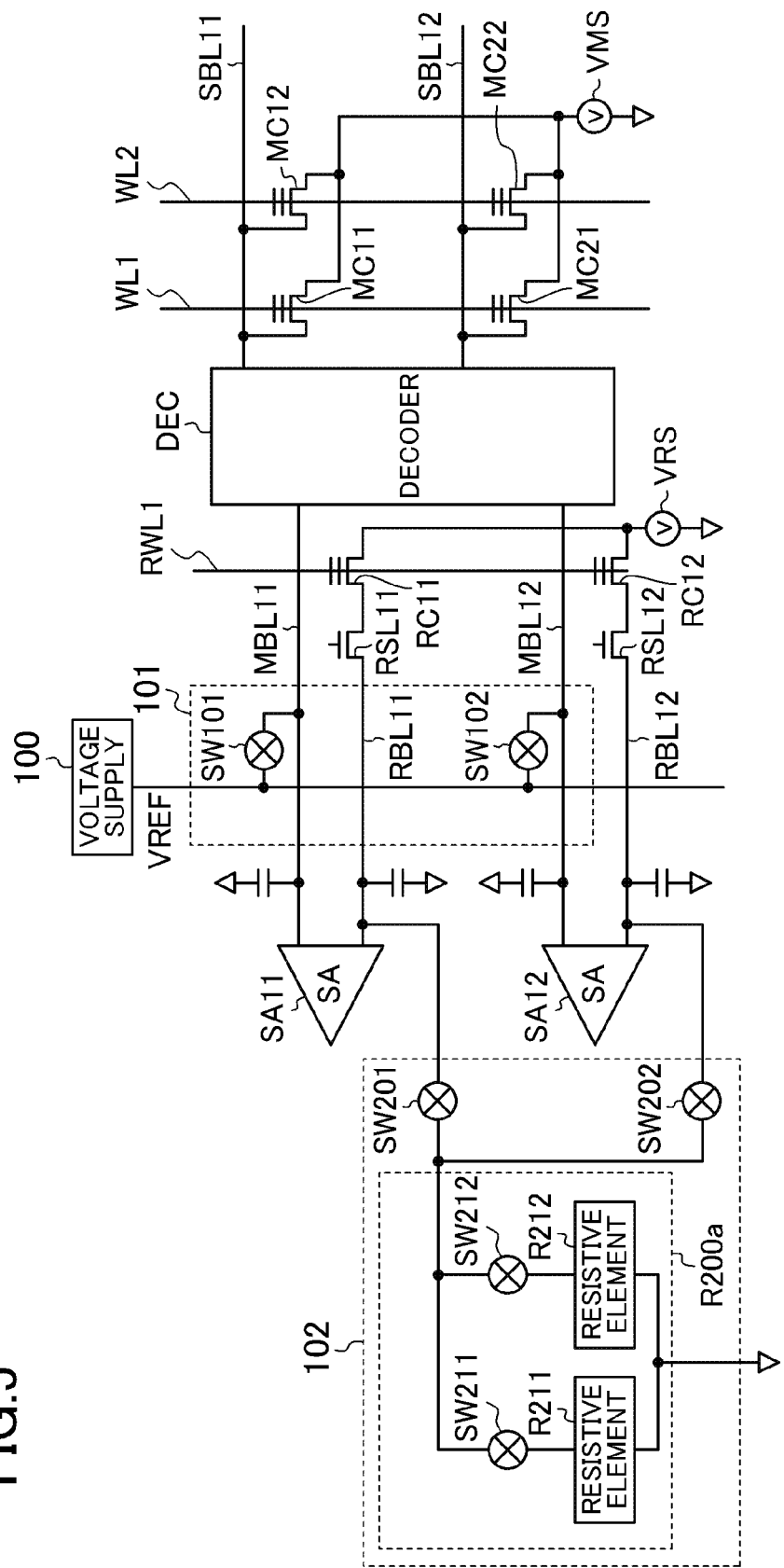
FIG. 5 illustrates a first variation of a resistance switching section shown in FIG. 1.

A resistance value of the resistance switching section 102 may be either fixed or variable. For example, the resistance switching section 102 may include a variable resistive element R200a shown in FIG. 5 in place of the resistive element R200 shown in FIG. 1. The variable resistive element R200a includes resistive elements R211 and R212, and switches SW211 and SW212. By controlling on/off of the switches SW211 and SW212, the resistance value of the resistance switching section 102 is variable. With this configuration, the resistance value of the resistance switching section 102 is controlled to equal a desired value, even when the resistance value of a resistive element is not equal to a desired value due to manufacturing variations. Note that the resistance switching section 102 may include three or more resistive elements and three or more switches.

Second Variation of Resistance Switching Section

Figure 6:
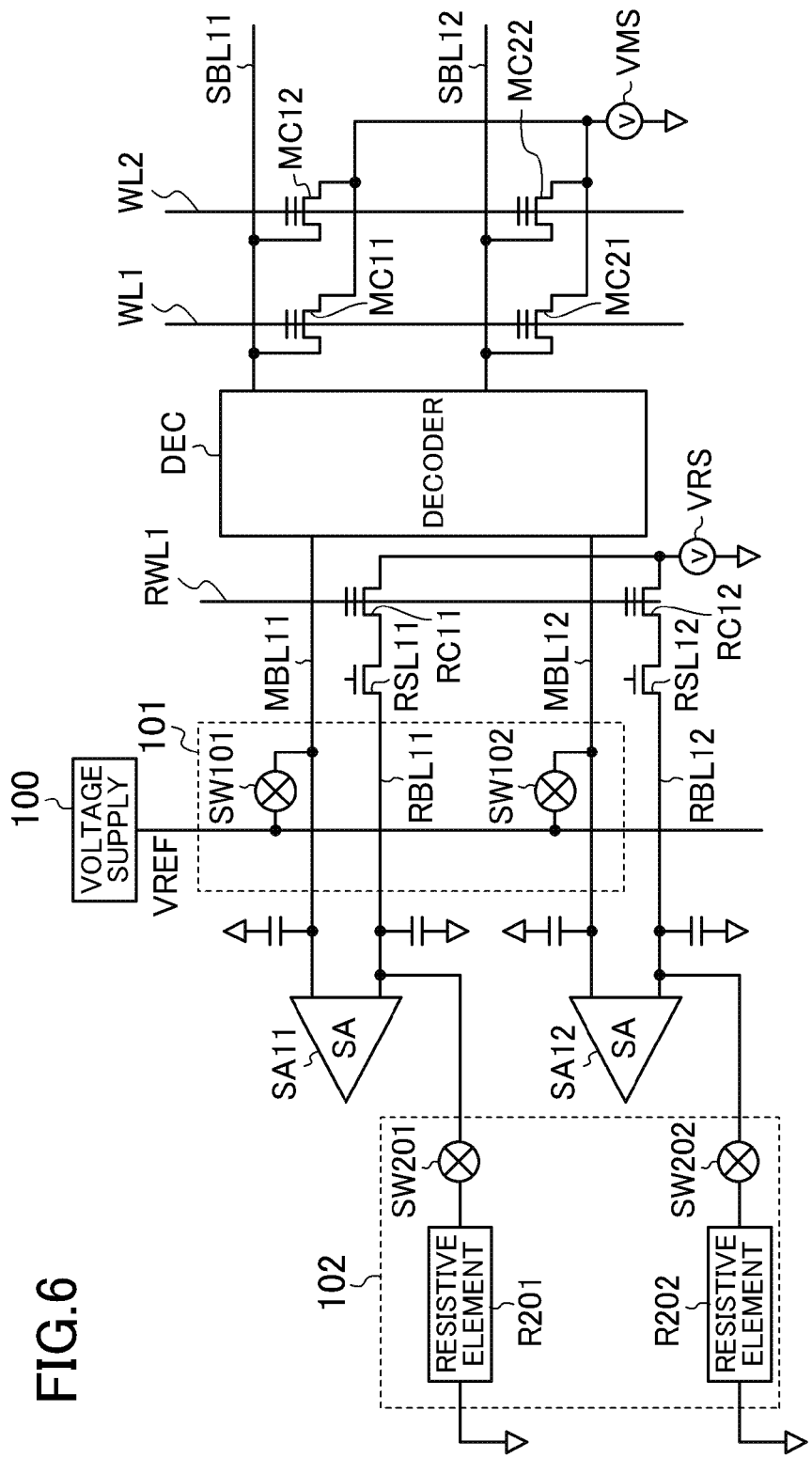
FIG. 6 illustrates a second variation of the resistance switching section shown in FIG. 1.

The resistance switching section 102 may include resistive elements R201 and R202 shown in FIG. 6 in place of the resistive element R200 shown in FIG. 1. The resistive element R201 is coupled between the switch SW201 and the ground node, and the resistive element R202 is coupled between the switch SW202 and the ground node. That is, a resistive element is coupled via a switch in each reference bit line. With this configuration, the threshold voltage of a reference cell can be controlled in each sense amplifier.

Note that, in the semiconductor memory device of FIG. 6, the threshold voltages of two or more reference cells may be controlled in parallel. Specifically, the voltage supply switching section 101 may supply a reference voltage to each of two or more main bit lines corresponding to the two or more reference bit lines in which currents according to the threshold voltages of the two or more reference cells are generated. The resistance switching section 102 may form electrical connection between the ground node and each of the two or more reference bit lines with a resistance value corresponding to the reference bit line. For example, all of the switches SW101, SW102, SW201, and SW202 are put in a conduction state, thereby controlling the threshold voltages of the reference cells RC11 and RC12 in parallel.

Third Variation of Resistance Switching Section

Figure 7:
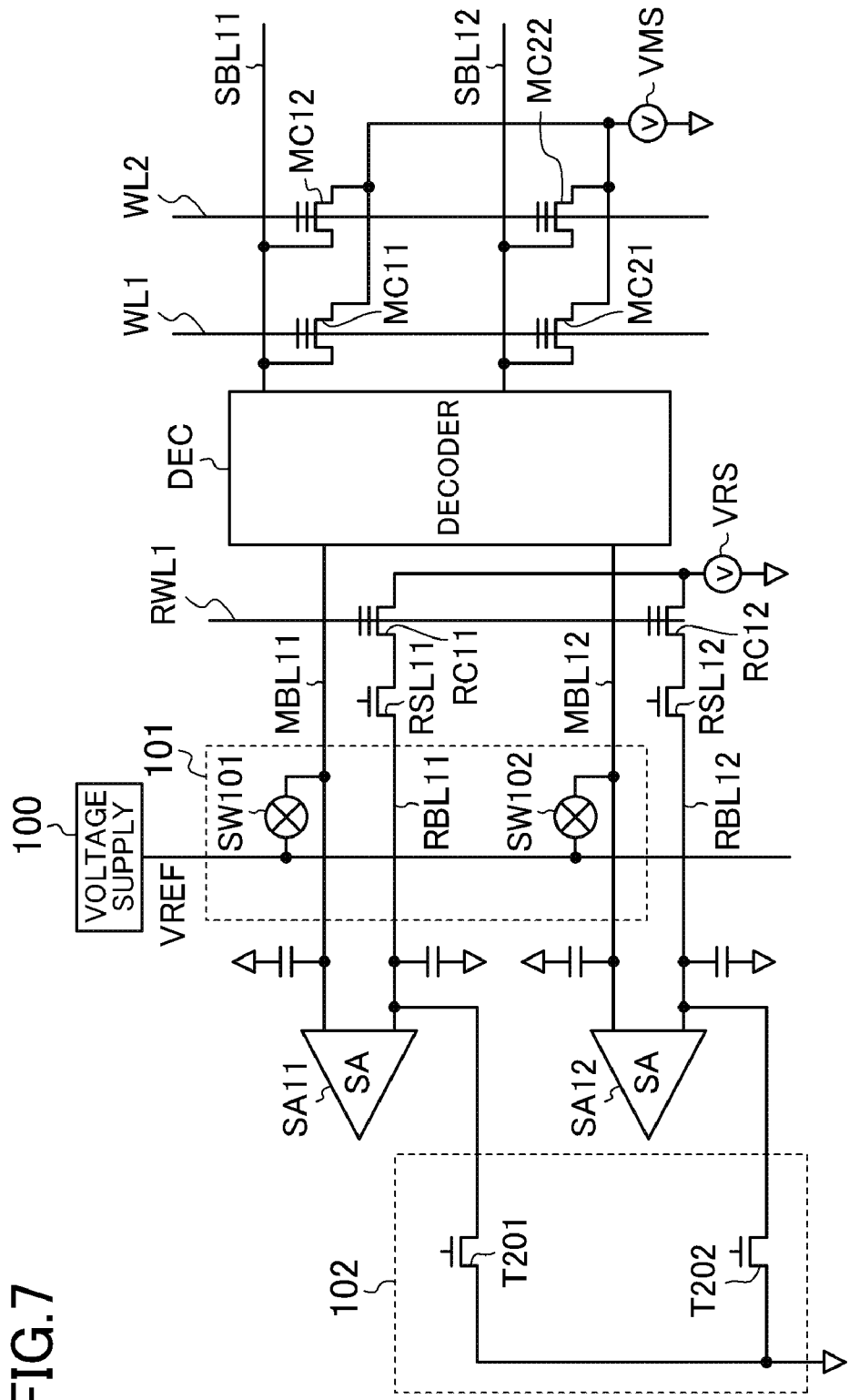
FIG. 7 illustrates a third variation of the resistance switching section shown in FIG. 1.

The resistance switching section 102 may include resistance transistors T201 and T202 shown in FIG. 7. The resistance transistor T201 is coupled between the reference bit line RBL11 and the ground node, and the resistance transistor T202 is coupled between the reference bit line RBL12 and the ground node. Resistance values (on-resistance values) of the resistance transistors T201 and T202 can be controlled by gate voltages of the transistors.

When the threshold voltages of the reference cells are controlled, voltages are applied to the gates of the resistance transistors T201 and T202 to allow the resistance transistors to operate in a triode region. By applying such voltages, the resistance transistors T201 and T202 are used as resistive elements. In normal read operation, voltages (e.g., 0 V) are applied to the gates of the resistance transistors T201 and T202 to put the resistance transistors in a non-conduction state. That is, the resistance transistors T201 and T202 can switch between the conduction state allowing a current to pass with a predetermined resistance value and the non-conduction state not allowing a current to pass, in accordance with the gate voltages. With this configuration, the area of the resistance switching section 102 can be reduced, since there is no need to separately provide a resistive element and a switch. Furthermore, by forming the resistance switching section 102 to control the number of the transistors T201 and T202, fluctuations in the resistance values caused by manufacturing variations can be compensated, and control precision of the threshold voltages of the reference cells can be improved.

Configuration of Resistive Element

In the above description, the resistive elements R200, R201, and R202 may be MOS transistors to which predetermined gate voltages are applied. Alternately, the resistive elements R200, R201, and R202 may be polysilicon resistors. In this case, resistance variations can be reduced, and control precision of the threshold voltages of the reference cells can be improved. Furthermore, the resistive elements R200, R201, and R202 may be well resistors. In this case, relatively large sheet resistances are provided, thereby reducing an area required for the resistive elements.

Variation of Voltage Supply Switching Section

Figure 8:
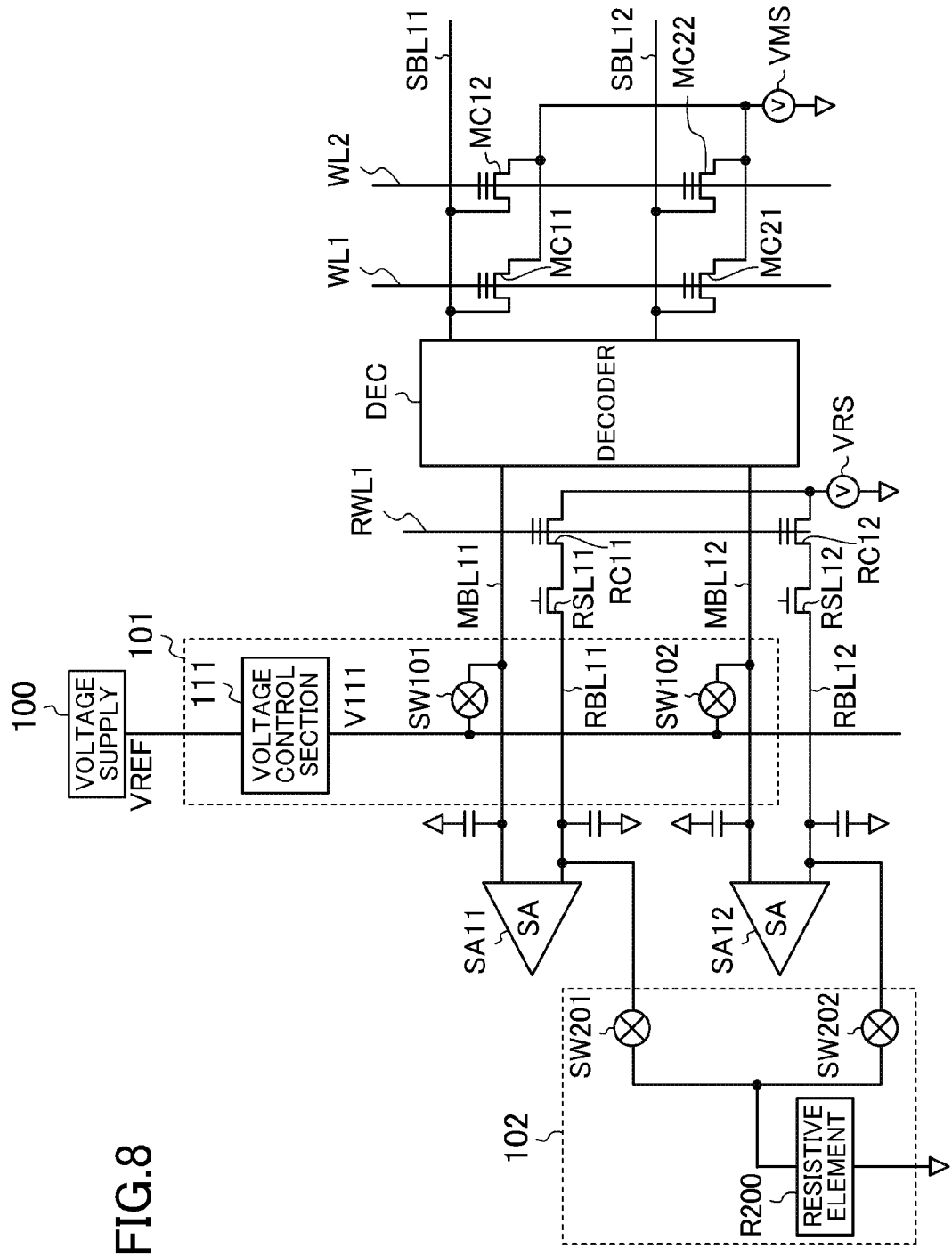
FIG. 8 illustrates a variation of a voltage supply switching section shown in FIG. 1.
Figure 9:
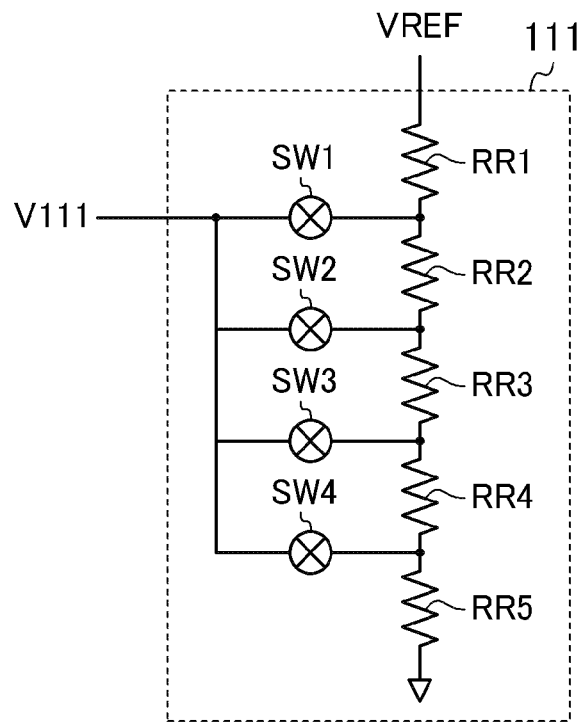
FIG. 9 illustrates an example configuration of a voltage control section shown in FIG. 8.
Figure 10:
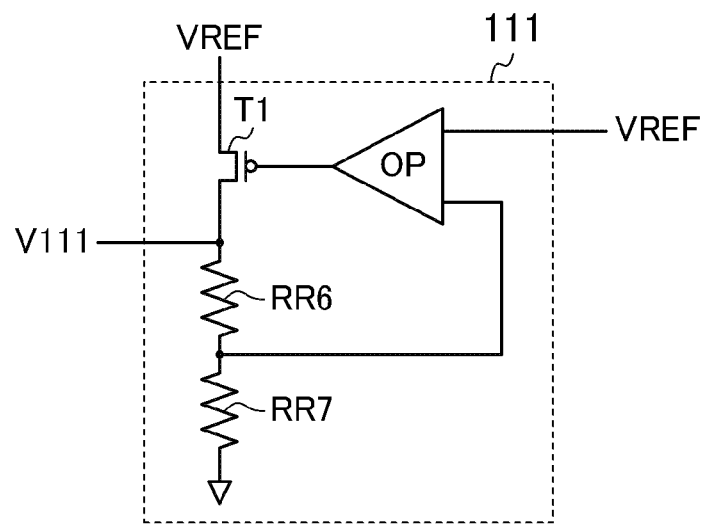
FIG. 10 illustrates another example configuration of the voltage control section shown in FIG. 8.

The voltage supply switching section 101 may further include a voltage control section 111 shown in FIG. 8 in addition to the configuration shown in FIG. 1. With this configuration, the threshold voltages of the reference cells can be set to any value. Even when a reference voltage VREF from the voltage supply 100 fluctuates due to manufacturing variations, the reference voltage VREF is compensated and output as a reference voltage V111, thereby reducing degradation in control precision of the threshold voltages of the reference cells due to the fluctuations in the reference voltage VREF. Note that the voltage control section 111 may be, as shown in FIG. 9, a resistance dividing circuit including a plurality of resistive elements RR1, RR2, ..., RR5 coupled in series, and a plurality of switches SW1, SW2, ..., SW4 coupled to respective connection nodes of the plurality of resistive elements RR1, RR2, ..., RR5. Alternately, the voltage control section 111 may be, as shown in FIG. 10, a regulator circuit including a transistor T1 and resistive elements RR6 and RR7 coupled in series, and an operational amplifier OP. By using a resistance dividing circuit as the voltage control section 111, the circuit configuration can be simplified as compared to the case where a regulator circuit is used as the voltage control section 111. On the other hand, by using a regulator circuit as the voltage control section 111, resistance to fluctuations in a power supply voltage can be improved to reduce degradation in control precision of the threshold voltages of the reference cells caused by the fluctuations in the power supply voltage, as compared to the case where a resistance dividing circuit is used as the voltage control section 111.

Pad

Figure 11:
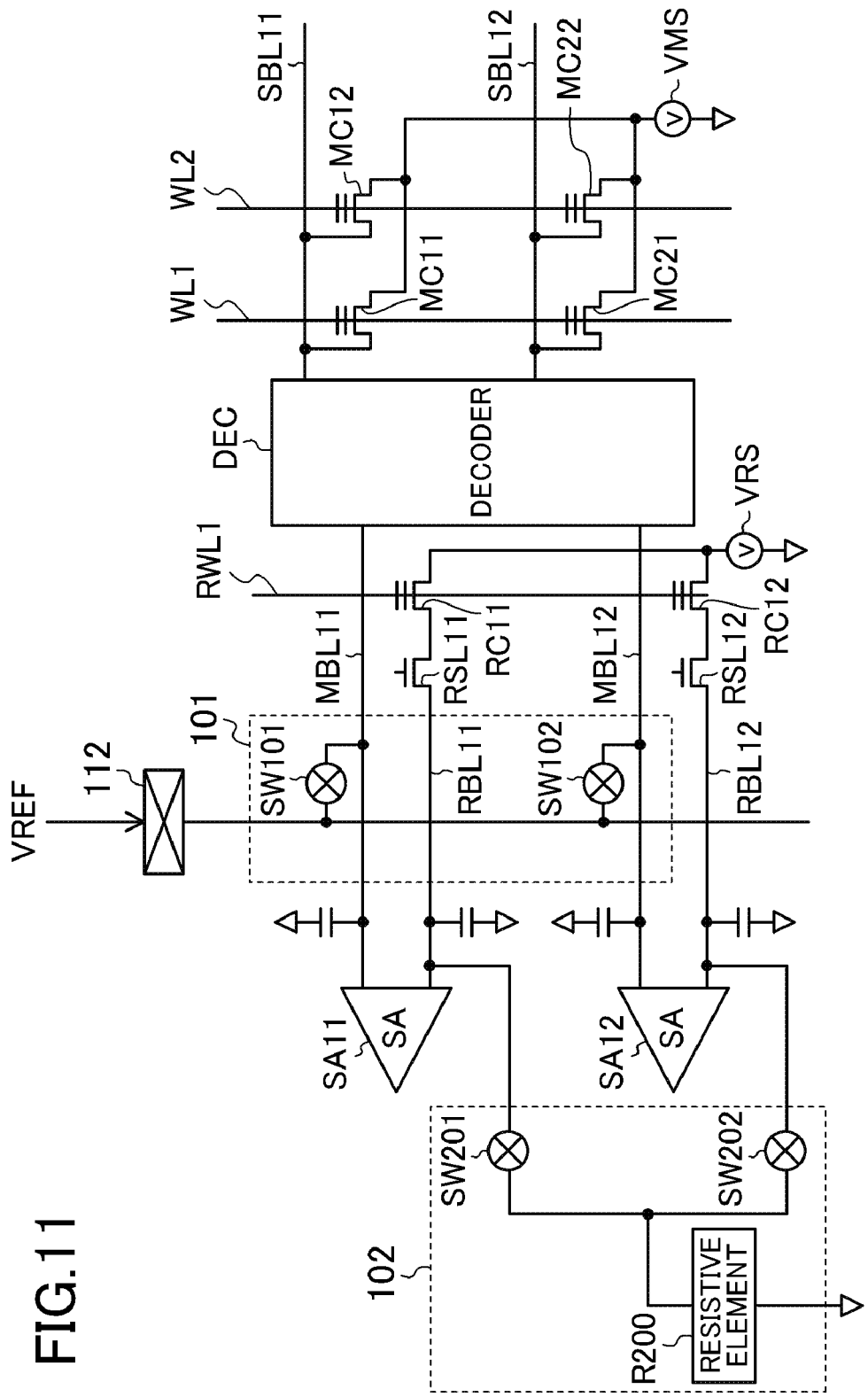
FIG. 11 illustrates a variation of the semiconductor memory device shown in FIG. 1.

The semiconductor memory device shown in FIG. 1 may include a pad 112 shown in FIG. 11 in place of the voltage supply 100. A reference voltage VREF from a voltage supply provided outside the semiconductor memory device is applied to the pad 112. With this configuration, the external voltage supply sets the reference voltage VREF to any value. Furthermore, the area of the semiconductor memory device can be reduced, since there is no need to provide the voltage supply 100 inside the semiconductor memory device.

Second Embodiment

Figure 12:
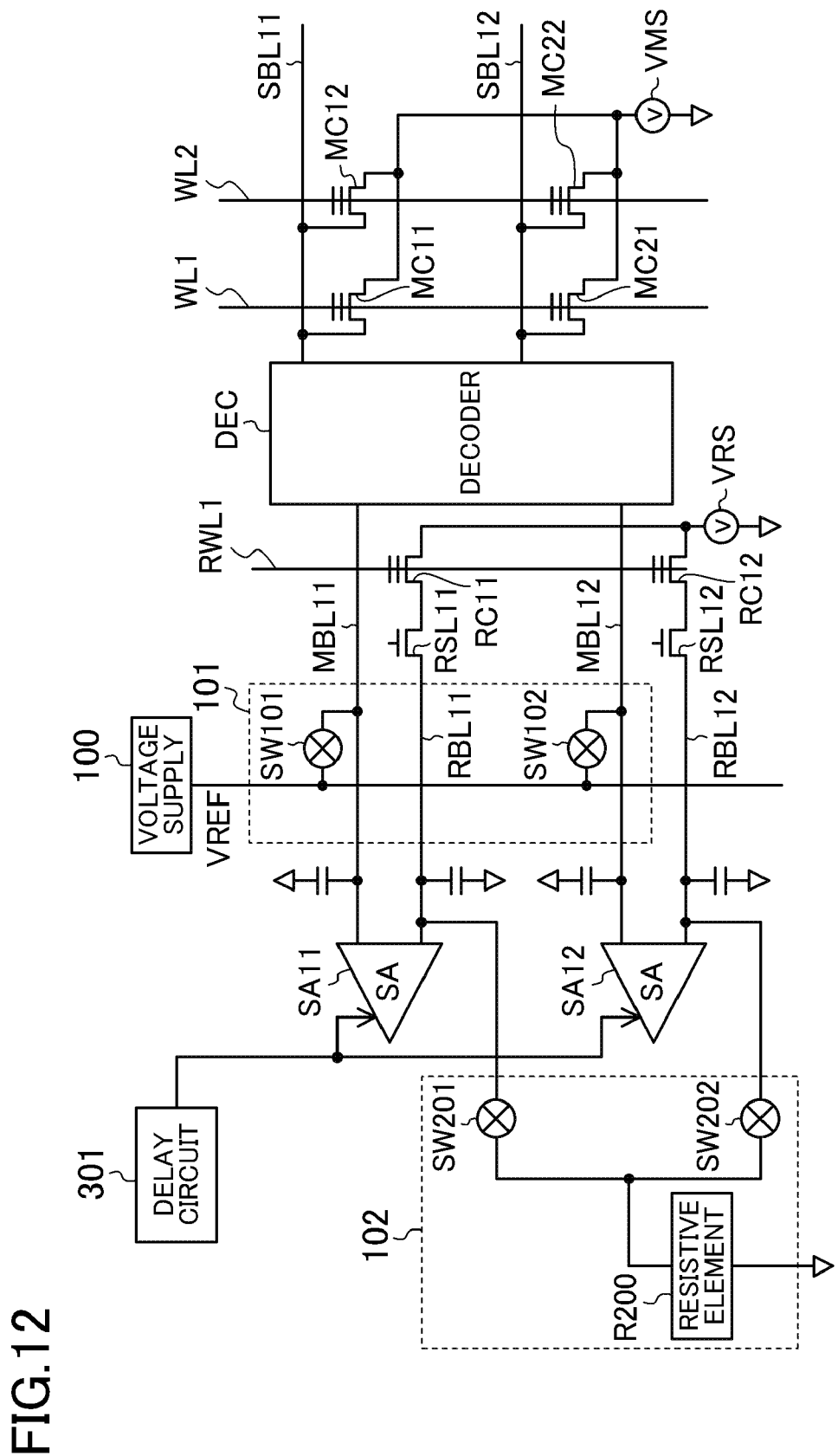
FIG. 12 illustrates an example configuration of a semiconductor memory device according to a second embodiment.

FIG. 12 illustrates an example configuration of a semiconductor memory device according to a second embodiment. The semiconductor memory device includes a delay circuit 301 in addition to the configuration of the semiconductor memory device shown in FIG. 1. The delay circuit 301 supplies control signals (e.g., a differential start signal) or a latch start signal) to the sense amplifiers SA11 and SA12 at timing delayed from timing of normal read operation. This configuration allows the sense amplifiers SA11 and SA12 to execute comparison and determination at stable timing, thereby improving control precision of the threshold voltages of the reference cells.

Note that the delay circuit 301 may be an inverter delay circuit including a single-stage inverter or a plurality of cascade-coupled inverters, or may be a microcontroller. With this configuration, output timing of the differential start signal and a latch start signal can be set to any timing, thereby improving control precision of the threshold voltages of the reference cells. By using a microcontroller as the delay circuit 301, the threshold voltage of the reference cell can be automatically controlled.

Third Embodiment

Figure 13:
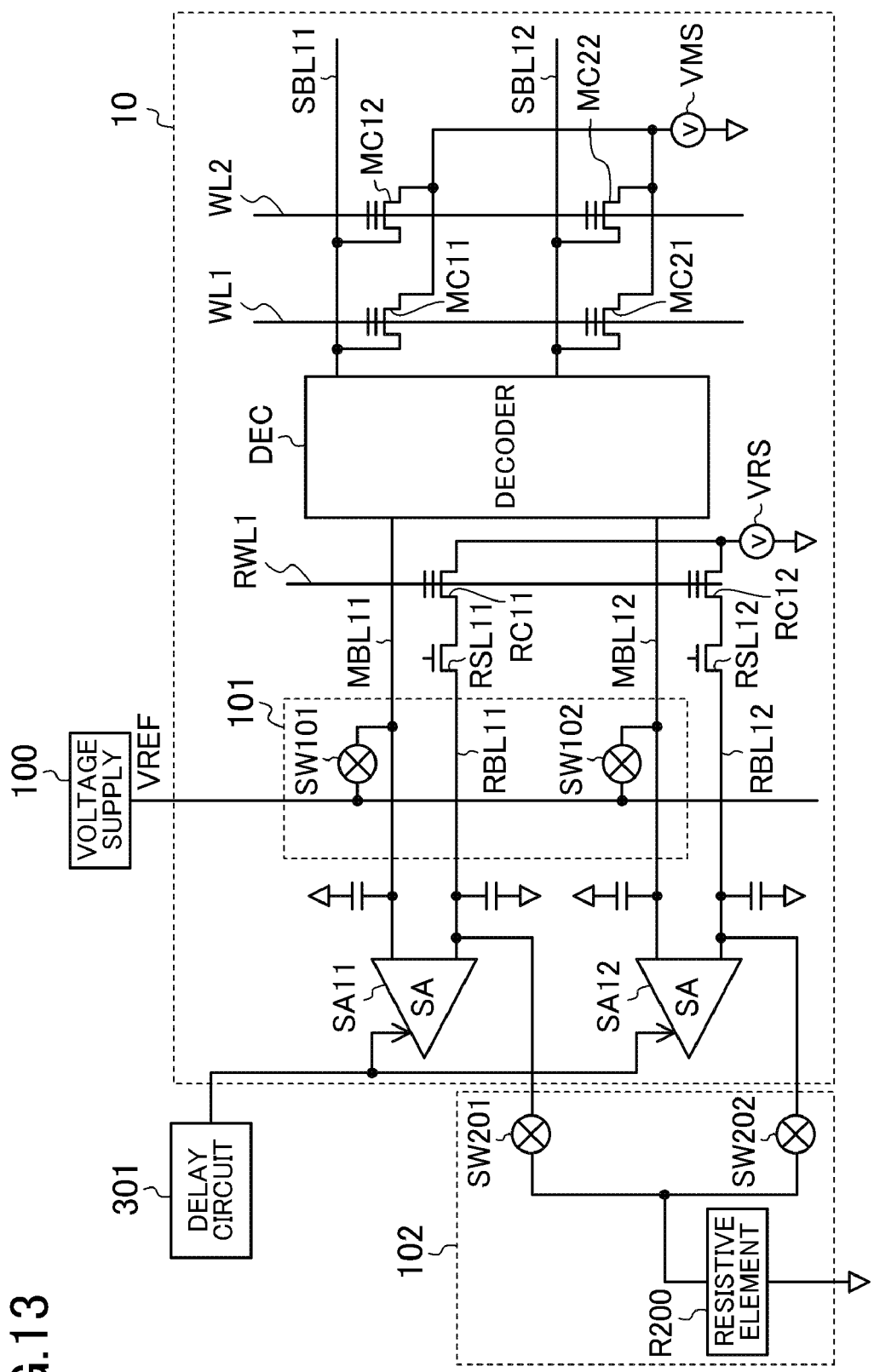
FIG. 13 illustrates an example configuration of a semiconductor integrated circuit according to a third embodiment.
Figure 14:
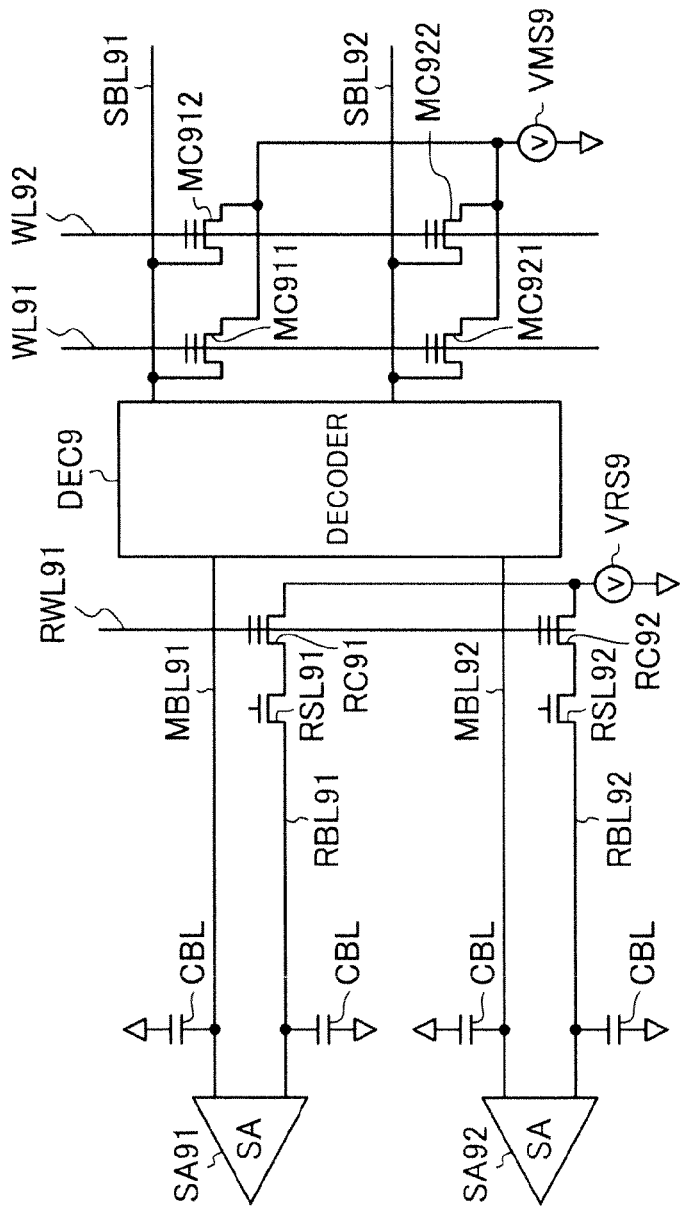
FIG. 14 illustrates a configuration of a conventional semiconductor memory device.
Figure 15:
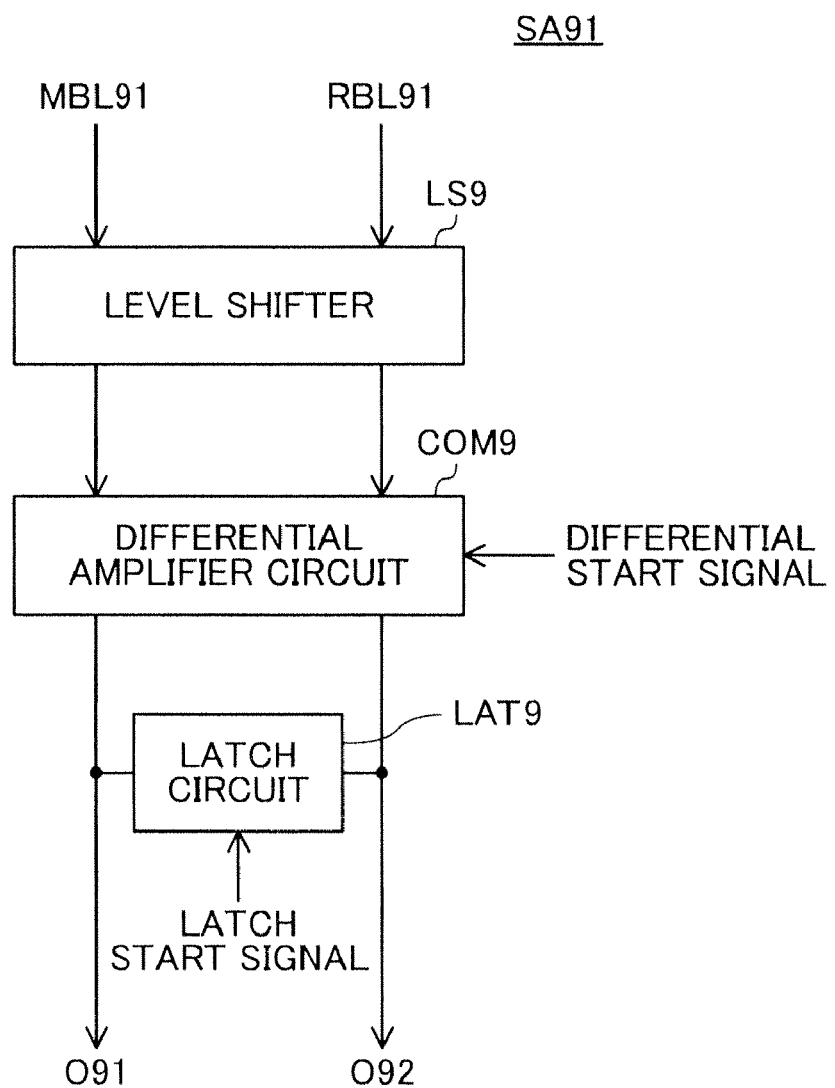
FIG. 15 illustrates a configuration of a sense amplifier shown in FIG. 14.
Figure 16:
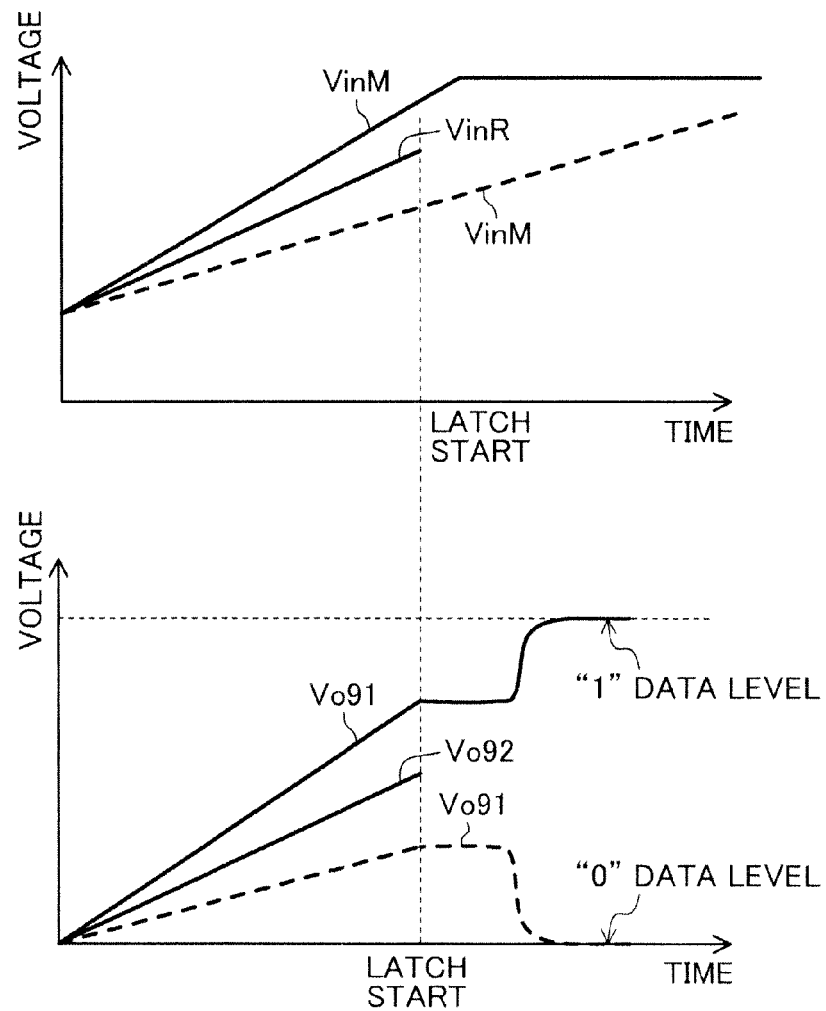
FIG. 16 illustrates operation of the sense amplifier shown in FIG. 15.

FIG. 13 illustrates an example configuration of a semiconductor integrated circuit (or an electronic device) according to a third embodiment. The semiconductor integrated circuit (or the electronic device) includes a semiconductor memory device 10, a voltage supply 100, a resistance switching section 102, and a delay circuit 301. The semiconductor memory device 10 includes the memory cells MC11, MC12, MC21, and MC22, the word lines WL1 and WL2, the sub bit lines SBL11 and SBL12, the voltage supply VMS, the decoder DEC, the main bit lines MBL11 and MBL12, the reference cells RC11 and RC12, the reference word line RWL1, the voltage supply VRS, the switches RSL11 and RSL12, the reference bit lines RBL11 and RBL12, and the sense amplifiers SA11 and SA12 shown in FIG. 1. The connection of these elements is similar to that in FIG. 1. Specifically, the voltage supply 100, the resistance switching section 102, and the delay circuit 301 may be provided outside the semiconductor memory device. The voltage supply 100, the resistive element R200, the delay circuit 301 may be used in a circuit in the semiconductor integrated circuit (or the electronic device) other than the semiconductor memory device 10. With this configuration, the area of the semiconductor memory device can be reduced.

As described above, the above-described semiconductor memory device reduces influences of noise to threshold value determination of the reference cells, and accurately controls the threshold voltages of the reference cells, and is thus, suited for semiconductor integrated circuits and electronic devices.

Note that the embodiments are intrinsically preferred examples, and are not intended to limit the scope of the present disclosure, its application, and use.

What is claimed is:

1. A semiconductor memory device comprising:
a plurality of first main bit lines corresponding to at least one first memory cell;
a plurality of second main bit lines corresponding to at least one second memory cell;
at least one sense amplifier configured to output read data according to a difference between a voltage of any one of the plurality of first main bit lines and a voltage of any one of the plurality of second main bit lines;
a voltage supply switching section configured to supply a predetermined reference voltage to one of the plurality of first main bit lines corresponding to one of the plurality of second main bit lines in which a current according to a threshold voltage of the at least one second memory cell is generated; and
a resistance switching section configured to form electrical connection between a ground node and the one of the plurality of second main bit lines in which the current according to the threshold voltage of the at least one second memory cell is generated with a predetermined resistance value.

2. The semiconductor memory device of claim 1, wherein the resistance switching section includes
at least one resistive element coupled to the ground node at one end, and
at least one switch coupled between the other end of the at least one resistive element and the plurality of second main bit lines.

3. The semiconductor memory device of claim 2, wherein the at least one resistive element is any one of a MOS transistor, a polysilicon resistor, or a well resistor.

4. The semiconductor memory device of claim 1, wherein the resistance switching section include at least one resistance transistor coupled between the ground node and the plurality of second main bit lines, and
the at least one resistance transistor switches between a conduction state allowing a current to pass with a predetermined resistance value and a non-conduction state not allowing a current to pass, in accordance with a gate voltage of the at least one resistance transistor.

5. The semiconductor memory device of claim 1, wherein a resistance value of the resistance switching section is variable.

6. The semiconductor memory device of claim 1, wherein the resistance switching section forms electrical connection between the ground node and two or more of the plurality of second main bit lines with a common resistance value.

7. The semiconductor memory device of claim 1, wherein the resistance switching section individually forms electrical connection between the ground node and two or more of the plurality of second main bit lines with respective resistance values according to the two or more of the plurality of second main bit lines.

8. The semiconductor memory device of claim 1, wherein the reference voltage is variable.

9. The semiconductor memory device of claim 1, wherein the voltage supply switching section includes a voltage control section configured to control a voltage value of the reference voltage.

10. The semiconductor memory device of claim 9, wherein the voltage control section is a resistance dividing circuit.

11. The semiconductor memory device of claim 9, wherein the voltage control section is a regulator circuit.

12. The semiconductor memory device of claim 1, wherein the reference voltage is supplied from a voltage supply inside the semiconductor memory device.

13. The semiconductor memory device of claim 1, wherein the reference voltage is supplied from outside the semiconductor memory device.

14. The semiconductor memory device of claim 1, further comprising
a delay circuit configured to output a control signal controlling the at least one sense amplifier.

15. The semiconductor memory device of claim 14, wherein
the delay circuit is an inverter delay circuit including a single-stage inverter or a plurality of cascade-coupled inverters.

16. The semiconductor memory device of claim 14, wherein
the delay circuit is a microcontroller.

17. The semiconductor memory device of claim 1, wherein
a current according to a threshold voltage of the at least one first memory cell is generated in each of the plurality of first main bit lines in read operation, and
a current according to a threshold voltage of the at least one second memory cell is generated in each of the plurality of second main bit lines in the read operation and in control of the threshold voltage of the at least one second memory cell corresponding to the second main bit line,
the voltage supply switching section supplies the predetermined reference voltage to one of the plurality of first main bit lines corresponding to the one of the plurality of second main bit lines in which the current according to the threshold voltage of the at least one second memory cell is generated in the control of the threshold voltage of the at least one second memory cell, and
the resistance switching section forms electrical connection between the ground node and the one of the plurality of second main bit lines in which the current according to the threshold voltage of the at least one second memory cell is generated with the predetermined resistance value in the control of the threshold voltage of the at least one second memory cell.

18. A semiconductor integrated circuit comprising:
a semiconductor memory device including
a plurality of first main bit lines corresponding to at least one first memory cell,
a plurality of second main bit lines corresponding to at least one second memory cell, and
at least one sense amplifier configured to output read data according to a difference between a voltage of any one of the plurality of first main bit lines and a voltage of any one of the plurality of second main bit lines;
a voltage supply switching section configured to supply a predetermined reference voltage to one of the plurality of first main bit lines corresponding to one of the plurality of second main bit lines in which a current according to a threshold voltage of the at least one second memory cell is generated; and
a resistance switching section configured to form electrical connection between a ground node and the one of the plurality of second main bit lines in which the current according to the threshold voltage of the at least one second memory cell is generated with a predetermined resistance value.

19. The semiconductor integrated circuit of claim 18, further comprising
a delay circuit configured to output a control signal controlling the at least one sense amplifier.

20. The semiconductor integrated circuit of claim 18, wherein
a current according to a threshold voltage of the at least one first memory cell is generated in each of the plurality of first main bit lines in read operation, and
a current according to a threshold voltage of the at least one second memory cell is generated in each of the plurality of second main bit lines in the read operation and in control of the threshold voltage of the at least one second memory cell corresponding to the second main bit line,
the voltage supply switching section supplies the predetermined reference voltage to one of the plurality of first main bit lines corresponding to the one of the plurality of second main bit lines in which the current according to the threshold voltage of the at least one second memory cell is generated in the control of the threshold voltage of the at least one second memory cell, and
the resistance switching section forms electrical connection between the ground node and the one of the plurality of second main bit lines in which the current according to the threshold voltage of the at least one second memory cell is generated with the predetermined resistance value in the control of the threshold voltage of the at least one second memory cell.

21. An electronic device comprising:
a semiconductor memory device including
a plurality of first main bit lines corresponding to at least one first memory cell,
a plurality of second main bit lines corresponding to at least one second memory cell, and
at least one sense amplifier configured to output read data according to a difference between a voltage of any one of the plurality of first main bit lines and a voltage of any one of the plurality of second main bit lines;
a voltage supply switching section configured to supply a predetermined reference voltage to one of the plurality of first main bit lines corresponding to one of the plurality of second main bit lines in which a current according to a threshold voltage of the at least one second memory cell is generated; and
a resistance switching section configured to form electrical connection between a ground node and the one of the plurality of second main bit lines in which the current according to the threshold voltage of the at least one second memory cell is generated with a predetermined resistance value.

22. The electronic device of claim 21, further comprising
a delay circuit configured to output a control signal controlling the at least one sense amplifier.

23. The electronic device of claim 21, wherein
a current according to a threshold voltage of the at least one first memory cell is generated in each of the plurality of first main bit lines in read operation, and
a current according to a threshold voltage of the at least one second memory cell is generated in each of the plurality of second main bit lines in the read operation and in control of the threshold voltage of the at least one second memory cell corresponding to the second main bit line,
the voltage supply switching section supplies the predetermined reference voltage to one of the plurality of first main bit lines corresponding to the one of the plurality of second main bit lines in which the current according to the threshold voltage of the at least one second memory cell is generated in the control of the threshold voltage of the at least one second memory cell, and
the resistance switching section configured to form electrical connection between a ground node and the one of the plurality of second main bit lines in which the current according to the threshold voltage of the at least one second memory cell is generated with a predetermined resistance value in the control of the threshold voltage of the at least one second memory cell.

* * * * *